United States Patent
Lee et al.

(10) Patent No.: US 6,177,342 B1
(45) Date of Patent: *Jan. 23, 2001

(54) METHOD OF FORMING DUAL DAMASCENE INTERCONNECTS USING GLUE MATERIAL AS PLUG MATERIAL

(75) Inventors: Tzung-Han Lee, Taipei; Li-Chieh Chao, Taoyuan Hsien, both of (TW)

(73) Assignee: United Microelectronics Corp, Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/075,422

(22) Filed: May 8, 1998

(30) Foreign Application Priority Data

Mar. 17, 1998 (TW) .................................................. 87103896

(51) Int. Cl.$^7$ ......................... H01L 21/4763; H01L 21/44
(52) U.S. Cl. ......................... 438/638; 438/633; 438/637; 438/653; 438/628; 438/654; 438/685; 438/687; 438/688

(58) Field of Search ...................................... 438/638, 644, 438/648, 643, 637, 640, 625, 628, 631, 633, 639, 653, 687, 688, 654, 685; 257/774, 775

(56) References Cited

U.S. PATENT DOCUMENTS

| | | | |
|---|---|---|---|
| 4,855,252 | * 8/1989 | Peterman et al. | 437/189 |
| 5,104,826 | * 4/1992 | Fujita et al. | 437/190 |
| 5,604,156 | * 2/1997 | Chung et al. | 437/195 |
| 5,874,355 | * 2/1999 | Huang et al. | 438/627 |
| 5,893,752 | * 4/1999 | Zhang et al. | 438/687 |
| 5,897,369 | * 4/1999 | Jun | 438/629 |

* cited by examiner

Primary Examiner—John F. Niebling
Assistant Examiner—Ha Tran Nguyen
(74) Attorney, Agent, or Firm—Jiawei Huang; J C Patents

(57) ABSTRACT

An multi-level interconnection uses a glue layer material as a via plug or contact plug. An method of forming the multi-level interconnection includes: forming a first opening and a wider second opening in a dielectric layer, whereas the first opening exposes the conductive layer and the second opening is above the first opening; and filling the first opening with titanium, titanium nitride or tungsten nitride.

21 Claims, 3 Drawing Sheets

US 6,177,342 B1

METHOD OF FORMING DUAL DAMASCENE INTERCONNECTS USING GLUE MATERIAL AS PLUG MATERIAL

CROSS-REFERENCE TO RELATED APPLICATION

This application claims the priority benefit of Taiwan application serial no. 87103896, filed Mar. 17, 1998, the full disclosure of which is incorporated herein by reference.

BACKGROUND OF THE INVENTION

1. Field of the Invention

The invention relates in general to a structure of a multi-level interconnection and a method of fabricating the same, and more particularly to the structure and the fabrication of a multi-level interconnection without using a barrier layer.

2. Description of the Related Art

The increasing of the integration of the integrated circuited (IC) causes the insufficiency of the chip surface for formation of interconnection. To satisfy the requirement of more wiring lines as the device size is shrinking, a design of multi-level interconnection is needed for IC fabrication. The multi-level interconnection is a three-dimensional wiring line structure. To form a multi-level interconnection structure, the first or lower layer of the metal wiring line is first formed, connecting with the source/drain region of the metal-oxide semiconductor transistor (MOS) on a substrate by a contact plug through a contact hole. The second layer of the metal wiring line is then formed, connecting with the first metal wiring line by a via plug through a plug hole. The metal wiring lines can either be made from metal or any conductive material such as polysilicon. More than two layers of metal wiring lines can be formed if necessary.

Conventionally, there are two ways for fabricating plugs and metal lines. The first method includes two steps of forming a plug and a metal wiring line, respectively. A dielectric layer is first formed above a region desired for being coupled. After forming a opening in the dielectric layer by photolithography, a conductive material is deposited in the opening to accomplish the plug. Then, a metal layer is deposited and patterned to form a metal wiring line, connecting with the plug. Finally, an inter-metal dielectric layer is deposited. The other method utilizes a damascene technique, which accomplishes the plug and the metal wiring line simultaneously.

Referring to FIG. 1, which is a cross-sectional views showing the structure of the plug and the metal wiring line fabricated a conventional damascene technique. On a semiconductor substrate 10, a conductive layer 12 is first formed. Then, a dielectric layer 14 id formed on the conductive layer, using a material such as a dielectric layer with low dielectric coefficient. In the dielectric layer 14, an opening 15 and an opening 13 are formed successively. Next, a glue layer 16 is formed on the opening 15 and the opening 13. Generally, the common material for the glue layer 16 includes titanium/titanium nitride (Ti/TiN), tungsten nitride (WN), tantulum or tantulum nitride (TaN). The glue layer 16 is used to enhance the adhesive force of the later deposited conductive material and obstruct the diffusion of the conductive material. Then, a conductive layer 18, such as conductive materials of superior conductivity, tungsten or aluminum. Then, a chemical mechanical polishing (CMP) is performed to accomplish the conventional damascene process.

However, as the size of semiconductor devices keeps on shrinking, the width of the via hole or the contact hole is desired to be narrower and the aspect ratio becomes much higher than before. Conventionally, before filling of the conductive material, a glue layer is formed on the inner periphery of the hole so that the width of the hole will reduce. If the step coverage of the conductive material is poor, which is usually in this case and difficult to overcome, short circuit tends to occur and the difficulties in filling conductive layer into the hole becomes even greater.

SUMMARY OF THE INVENTION

It is therefore an object of the invention to provide a metal damascene process without a glue layer but filling metal material directly into the contact hole or via hole.

An multi-level interconnection using a glue layer material as a via plug or contact plug is disclosed.

An method of forming the multi-level interconnection is further disclosed, which includes: forming a first opening and a wider second opening in a dielectric layer, whereas the first opening exposes the conductive layer and the second opening is above the first opening; and filling the first opening with titanium, titanium nitride or tungsten nitride.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
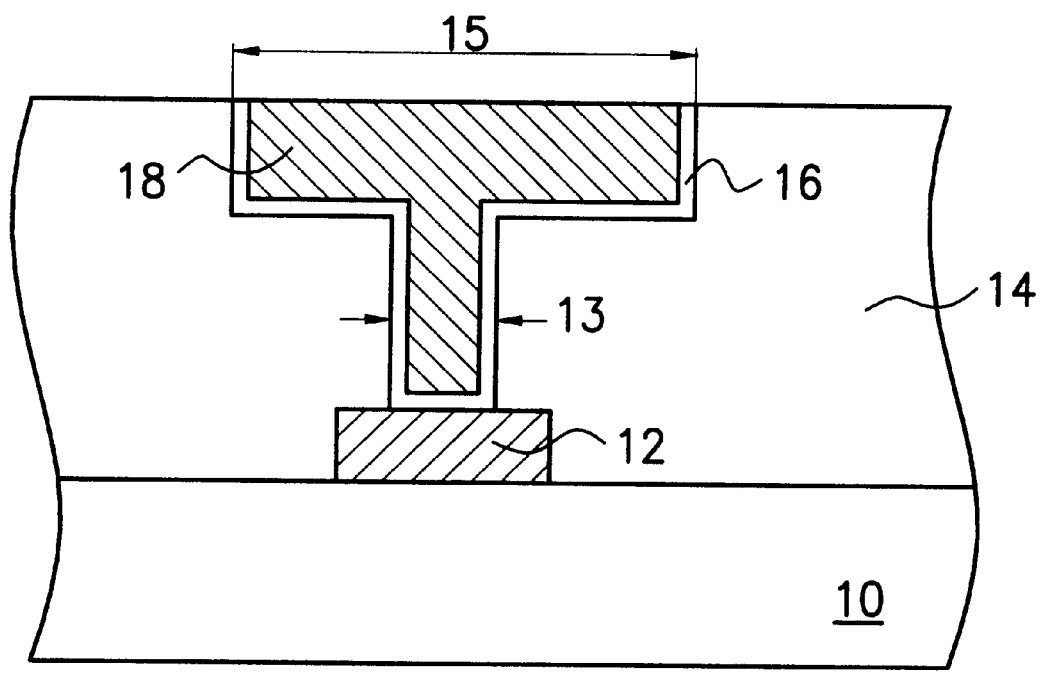
FIG. 1 is a cross-sectional view showing a structure of a plug and a metal wiring line according to a conventional process.
Figure 2A:
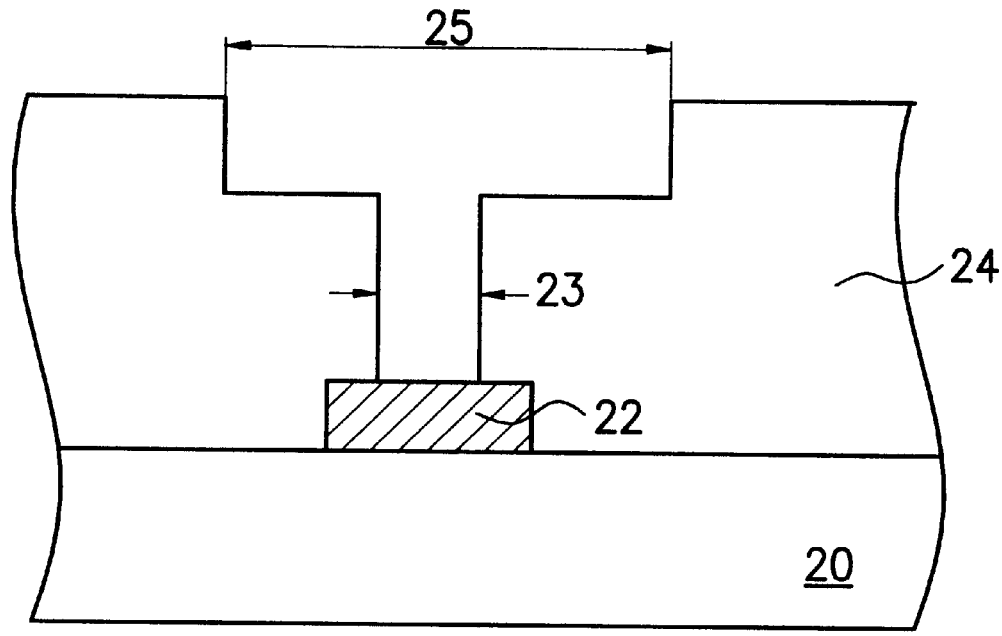
FIGS. 2A to 2D are cross-sectional views showing the damascene process steps of fabricating a plug and a metal wiring line in accordance with a preferred embodiment of the invention.

Referring to FIG. 2A, the area numbered as 22 represents a conductive layer 22, which can be one of the source/drain regions of a transistor device, the metal layer of a gate structure or a metal layer of an interconnection, whereas the MOS device on the substrate 20 is not completely shown. On the substrate 20, a dielectric layer 24 is formed to cover the conductive layer 22. The dielectric layer 24 is further processed to form an opening 23 and an opening 25 therein. The opening 23 exposes the conductive layer 22. The opening 25 is above the opening 293 and has a width larger than the opening 23. The material of the dielectric layer 24 is preferrably dielectric of relatively low dielectric coefficient.

Figure 2B:
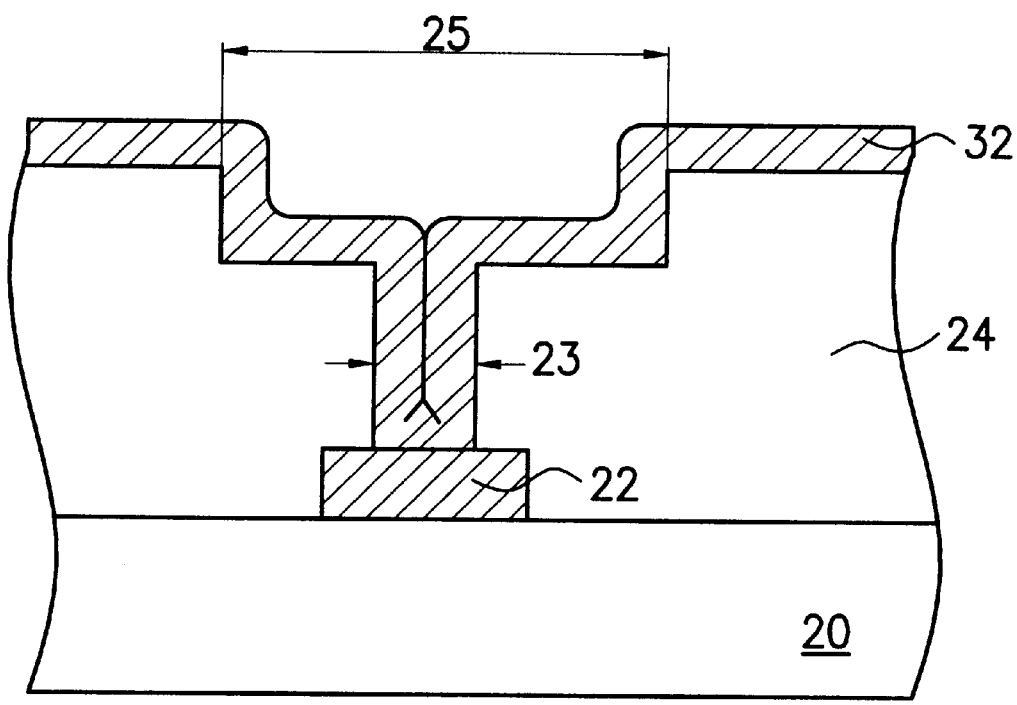

Referring to FIG. 2B, a conductive layer 32 is formed over the surface of the substrate 20. The material of the conductive layer 32 is preferrably titanium, tiatnium nitride, tungsten nitride or the other material suitable for glue layers. The conductive layer 32 is formed until at least the opening 23 is completely filled and the conductive layer 32 is formed to be coupled with the exposed portion of the conductive layer 22. The portion of the conductive layer 32 in the opening 23 serves as a conventional via plug or contact plug. The thickness of the conductive layer 32 is substantially larger than the radius of the opening 23. For example, if the conductive layer 32 is made of titanium, the conductive layer 32 can be formed by magnetic DC sputtering. The technique of magnetic DC sputtering provides the conductive layer 32, such as titanium, titanium nitride or tungsten nitride, with excellent step coverage and superior density.

Conventionally, a glue layer is formed on the inner periphery of the opening before the formation of a metal layer in order to enhance the adhesive force between the metal layer and the dielectric layer. However, the formation of the glue layer even further increase the aspect ratio of the opening and causes difficulties in the continuous process of metal deposition. According to the invention, the conventional glue layer is formed thicker to fill the opening to serve as a via plug or a contact plug, which therefore overcome the problems coming with higher aspect ratio. Even more, the conductive layer 32 not only has the function of the glue layer but also has the advantage of higher transmission rate.

Figure 2C:
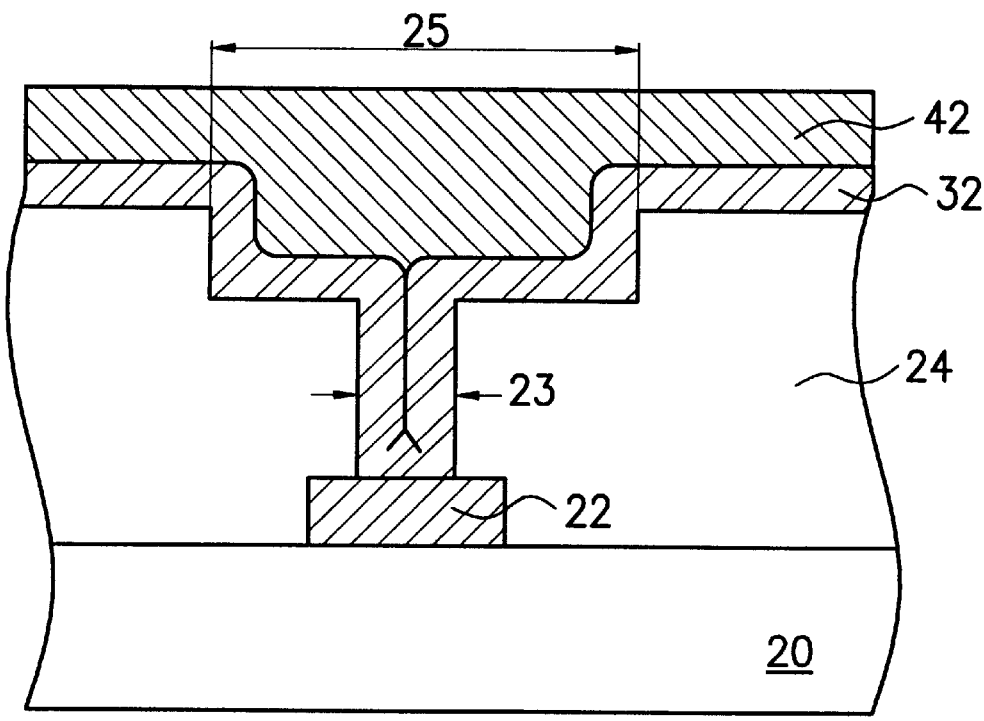

Next, referring to FIG. 2C, a metal layer 42 is further deposited on the conductive layer 32 to completely fill the opening 25. The previously formed conductive layer 32 on the inner periphery of the opening 25 functions as a glue layer to increase the adhesive force between the dielectric layer 24 and the conductive layer 32. The material of the metal layer 42 can be aluminum, copper, tungsten or the like.

Figure 2D:
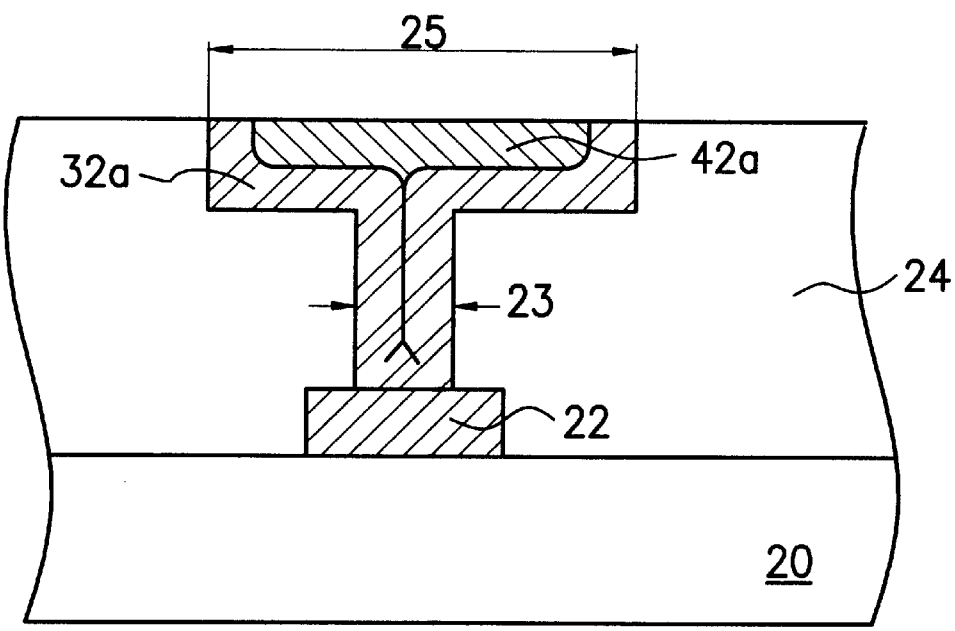

Next, referring to FIG. 2D, an etching back process, preferably a chemical mechanical polishing (CMP) process, is performed to remove the additional metal layer 42 and conductive layer 32, using the dielectric layer 24 as an etching stop. Consequently, a portion of the conductive layer 32a and the metal layer 42a are at about the same level as the surface of the dielectric layer 24. The metal layer 42a and a portion of the conductive layer 32a in the opening 25 together form the metal wiring line of the damascene structure.

It is therefore clear that the present invention has the following characteristics:

(1) The plug of the damascene structure is directly formed by using the conventional glue layer.

(2) The thickness of the conductive layer for a plug is substantially larger than the radius of the plug opening.

(3) Titanium plugs titanium nitride plugs or tungsten nitride plugs can all be formed according to the present invention.

(4) The conductive material formed to be a contact plug can functions as the glue layer of the via plug.

While the invention has been described by way of example and in terms of a preferred embodiment it is to be understood that the invention is not limited thereto. To the contrary, it is intended to cover various modifications and similar arrangements and procedures such as the formation of a multiple voltage transistor. The scope of the appended claims therefore should be accorded the broadest interpretation so as to encompass all such modifications and similar arrangements and procedures.

What is claimed is:

1. A method of fabricating a multi-level interconnection of a semiconductor device, wherein the multi-level interconnection is formed on a substrate, comprising:

forming a dielectric layer on a conductive layer, wherein, in the dielectric layer, there are a first opening exposing the conductive layer and a second opening above the first opening, and wherein the second opening is wider than the first opening;

forming only one homogeneous layer as a first conductive material to completely fill the first opening and partially fill the second opening, wherein the glue layer contacting said conductive layer and said dielectric layer; and forming a second conductive material to fill the second opening.

2. A method of claim 1, wherein the conductive layer comprises one of source/drain regions.

3. A method of claim 1, wherein the conductive layer comprises a metal layer of the multi-level interconnection.

4. A method of claim 1, wherein the first conductive material has a thickness substantially larger than a radius of the first opening.

5. A method of claim 1, wherein the first conductive material comprises titanium.

6. A method of claim 1, wherein the first conductive material comprises titanium nitride.

7. A method of claim 1, wherein the first conductive material comprises tungsten nitride.

8. A method of claim 1, wherein the second conductive material comprises aluminum.

9. A method of claim 1, wherein the second conductive material comprises copper.

10. A method of claim 1, wherein the second conductive material comprises tungsten.

11. A method of fabricating a multi-level interconnection of a semiconductor device, wherein the multi-level interconnection is formed on a first conductive layer on a substrate, comprising:

forming a dielectric layer on the first conductive layer, wherein, in the dielectric layer, there are a first opening exposing the first conductive layer and a second opening above the first opening, and wherein the second opening is wider than the first opening;

forming a homogeneous second conductive layer to fill the first opening, wherein the second conductive layer has a thickness substantially larger than a depth of the first opening;

forming a third conductive layer over the substrate to fill the second opening, wherein the second conductive layer contacting said first conductive layer and said dielectric layer; and performing an etching back process, using the dielectric layer as an etching stop layer, to remove additional third conductive layer and second conductive layer.

12. A method of claim 11, wherein the first conductive layer comprises one of source/drain regions.

13. A method of claim 11, wherein the first conductive layer comprises a metal layer of the multi-level interconnection.

14. A method of claim 11, wherein the second conductive layer is a glue layer.

15. A method of claim 11, wherein the second conductive material is a glue layer material.

16. A method of claim 11, wherein the second conductive material comprises titanium.

17. A method of claim 11, wherein the second conductive material comprises titanium nitride.

18. A method of claim 11, wherein the second conductive material comprises tungsten nitride.

19. A method of claim 11, wherein the third conductive material comprises aluminum.

20. A method of claim 11, wherein the third conductive material comprises copper.

21. A method of claim 11, wherein the third conductive material comprises tungsten.

* * * * *